(12) United States Patent
Yang et al.

(10) Patent No.: US 11,862,279 B2
(45) Date of Patent: Jan. 2, 2024

(54) METHOD AND DEVICE FOR DETERMINING REPAIRED LINE AND REPAIRING LINE IN MEMORY, STORAGE MEDIUM, AND ELECTRONIC DEVICE

(71) Applicant: CHANGXIN MEMORY TECHNOLOGIES, INC., Hefei (CN)

(72) Inventors: Bo Yang, Hefei (CN); Xiaodong Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 16 days.

(21) Appl. No.: 17/651,446

(22) Filed: Feb. 17, 2022

(65) Prior Publication Data

US 2023/0031361 A1 Feb. 2, 2023

Related U.S. Application Data

(63) Continuation of application No. PCT/CN2021/121341, filed on Sep. 28, 2021.

(30) Foreign Application Priority Data

Jul. 21, 2021 (CN) .......................... 202110824854.1

(51) Int. Cl.
*G11C 29/00* (2006.01)
*G11C 7/10* (2006.01)
*G11C 29/44* (2006.01)
*G11C 29/46* (2006.01)

(52) U.S. Cl.
CPC .......... *G11C 29/789* (2013.01); *G11C 7/1069* (2013.01); *G11C 7/1096* (2013.01); *G11C 29/4401* (2013.01); *G11C 29/46* (2013.01)

(58) Field of Classification Search
CPC ... G11C 29/789; G11C 7/1069; G11C 7/1096; G11C 29/4401
See application file for complete search history.

(56) References Cited

U.S. PATENT DOCUMENTS

| 2001/0009521 | A1* | 7/2001 | Hidaka | G11C 29/808 365/200 |
| 2016/0005496 | A1* | 1/2016 | Kim | G11C 17/16 365/96 |
| 2017/0148529 | A1* | 5/2017 | Kim | G11C 29/76 |
| 2020/0026628 | A1* | 1/2020 | Okada | G11C 29/26 |

FOREIGN PATENT DOCUMENTS

| CN | 110010187 A | 7/2019 |
| TW | 499680 B | 8/2002 |
| TW | I393145 B | 4/2013 |

* cited by examiner

*Primary Examiner* — Han Yang
(74) *Attorney, Agent, or Firm* — Syncoda LLC; Feng Ma (57) ABSTRACT

A method for determining a repaired line and a repairing line in a memory includes the following: writing first preset data sets into respective lines in a normal region, and writing second preset data sets into respective lines in a redundancy region; repairing the lines in the normal region by using the lines in the redundancy region; reading data from the lines in the normal region after repairing; and determining a repaired line in the normal region and a repairing line in the redundancy region according to the data of the lines in the normal region, the data of the lines in the normal region after repairing, or the data of the lines in the redundancy region.

18 Claims, 5 Drawing Sheets

METHOD AND DEVICE FOR DETERMINING REPAIRED LINE AND REPAIRING LINE IN MEMORY, STORAGE MEDIUM, AND ELECTRONIC DEVICE

CROSS-REFERENCE TO RELATED APPLICATIONS

This is a continuation of International Application No. PCT/CN2021/121341 filed on Sep. 28, 2021, which claims priority to Chinese Patent Application No. 202110824854.1 filed on Jul. 21, 2021. The disclosures of these applications are hereby incorporated by reference in their entirety.

BACKGROUND

As the manufacturing sizes of memories keep decreasing and the storage capacity of memories keeps increasing, failure problem in a memory chip arising during the development, production, and use is inevitable. A redundancy region may usually be used to repair failure positions in the memory chip.

It is to be understood that the information disclosed in the foregoing Background part is only used for better understanding of the background of the disclosure, and therefore may include information that does not constitute the prior art known to a person of ordinary skill in the art.

SUMMARY

The disclosure relates to the field of integrated circuit technologies, and specifically, to a method for determining the repaired line and the repairing line in a memory, a device for determining the repaired line and the repairing line in a memory, a computer-readable storage medium, and an electronic device.

According to an aspect of the disclosure, a method for determining a repaired line and a repairing line in a memory is provided. The method includes: writing first preset data sets into respective lines in a normal region, and writing second preset data sets into respective lines in a redundancy region, herein the second preset data sets written into the respective lines in the redundancy region are different, and the second preset data sets are different from the first preset data sets; repairing the lines in the normal region by using the lines in the redundancy region; reading data from the lines in the normal region after repairing; and determining a repaired line in the normal region and a repairing line in the redundancy region according to the data of the lines in the normal region, the data of the lines in the normal region after repair, or the data of the lines in the redundancy region.

According to an aspect of the disclosure, a device for determining a repaired line and a repairing line in a memory is provided. The device includes: a data write module, configured to write first preset data sets into respective lines in a normal region, and write second preset data sets in respective lines in a redundancy region, herein the second preset data sets written into the lines in the redundancy region are different, and the second preset data sets are different from the first preset data sets; a line repairing module, configured to use the lines in the redundancy region to repair the lines in the normal region; a data reading module, configured to read data from the lines in the normal region after repairing; and a line determination module, configured to determine a repaired line in the normal region and a repairing line in the redundancy region according to the data of the lines in the normal region, the data of the lines in the normal region after repairing, or the data of the lines in the redundancy region.

According to an aspect of the disclosure, a computer-readable storage medium is provided. The computer-readable storage medium stores thereon a computer program. The computer program is executed by a processor to implement the foregoing method for determining a repaired line and a repairing line in a memory.

It is to be understood that the foregoing general description and the following detailed description are only exemplary and explanatory, and cannot limit the disclosure.

BRIEF DESCRIPTION OF THE DRAWINGS

The accompanying drawings are incorporated in the description and constitute a part of the description, illustrate embodiments conforming to the disclosure, and are used together with the description to explain the principle of the disclosure. It is apparent that the accompanying drawings in the following description illustrate only some embodiments of the disclosure, and a person of ordinary skill in the art may still derive other drawings from these accompanying drawings without involving any inventive efforts. In the accompanying drawings.

DETAILED DESCRIPTION

Now exemplary embodiments will be described more fully with reference to the accompanying drawings. However, the exemplary embodiments can be implemented in various manners and shall not be construed as limited to the embodiments set forth herein. Instead, these embodiments are provided to make the disclosure comprehensive and complete, and fully convey the concept of the exemplary embodiments to those skilled in the art. Same reference numerals through the drawings denote the same or similar parts, and thus their repetitive description will not be elaborated.

Moreover, the features, structures, or characteristics described may be combined in any suitable manner in one or more embodiments. In the following description, many specific details are provided so as to give a full understanding of the embodiments of the disclosure. However, those skilled in the art will realize that the technical embodiments of the disclosure may be implemented without one or more of the specific details, or other methods, components, devices, steps, and the like may be adopted. In other cases, no well-known structures, methods, devices, implementations, materials or operations are illustrated or described in detail to avoid obscuring aspects of the disclosure.

The block diagrams illustrated in the accompanying drawings are only functional entities and do not necessarily have to correspond to physically separate entities. That is, these functional entities can be implemented in software form, or in one or more software-hardened modules or parts of functional entities, or in different network and/or processor apparatuses and/or microcontroller apparatuses.

In some implementations, repairing lines in a redundancy region are usually assigned according to a specific repair rule to repair failure positions.

The verification of the accuracy of executing a repair rule is a prerequisite for successful repair of failure positions in a chip.

One chip usually includes multiple cells. For example, a typical Dynamic Random-Access Memory (DRAM) chip has up to 64 million cells. These cells may be disposed in rows and columns to form a main array, to facilitate addressing through a Word Line (WL) and a Bit Line (BL).

In a manufacturing process of the typical DRAM chip, there may be one or more million defective cells (i.e., failure positions) in the main array. To improve the yield of chips, redundancy regions are usually manufactured in a chip. These redundancy regions may replace WLs or BLs at defective failure positions, to bypass these defective failure positions and to enable a memory to be normally used.

Generally, after failure positions occur in a chip during development, production, and use, specified lines in a redundancy region may be assigned according to a preset repair rule to repair the failure positions. The lines may be WLs or may be BLs.

However, in an actual repair process, whether a repair has actually been performed inside a chip according to a repair rule further requires related verification. If the repair has not been performed according to the repair rule, a fault is very likely to occur in a repair process, and repair for the failure positions may fail to achieve an expected objective, or even the chip may be discarded.

Based on this, this exemplary embodiment provides a method and a device for determining a repaired line and a repairing line in a memory.

Figure 1:
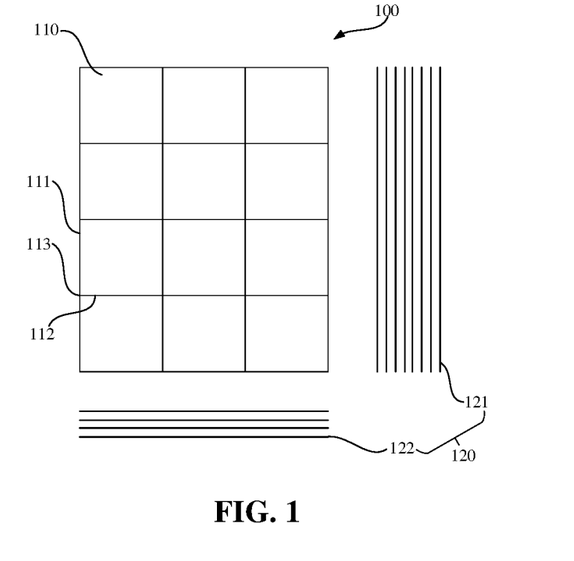
FIG. 1 illustrates a schematic structural diagram of a chip according to an exemplary embodiment of the disclosure.

FIG. 1 is a schematic structural diagram of a chip according to an exemplary embodiment of the disclosure. A chip 100 usually includes a normal region 110 and a redundancy region 120. The normal region 110 includes a plurality of cells. The normal region 110 includes two types of lines that are orthogonal to each other, i.e., WLs 111 and BLs 112. The WLs 111 are column lines, and the BLs 112 are row lines. Meanwhile, in addition to the normal region 110, the chip 100 is further provided with the redundancy region 120 including redundancy cells. The redundancy region 120 includes two types of straight lines that are orthogonal to each other, i.e., Redundancy Word-Lines (RWLs) 121 and Redundancy Bit-Lines (RBLs) 122. The RWLs 121 are column lines and are used for repairing the failure positions on the WLs 111. The RBLs 122 are row lines and are used for repairing the failure positions on the BLs 112. The arrangement positions and quantities of RWLs 121 and RBLs 122 in FIG. 1 are only an example, which does not constitute a limitation to the solution.

In a specific repair process, a specified RBL 122 may be used to repair a specified BL 112 according to a preset repair rule. Alternatively, a specified RWL 121 may be used to repair a specified WL 111 according to the preset repair rule.

Figure 2:
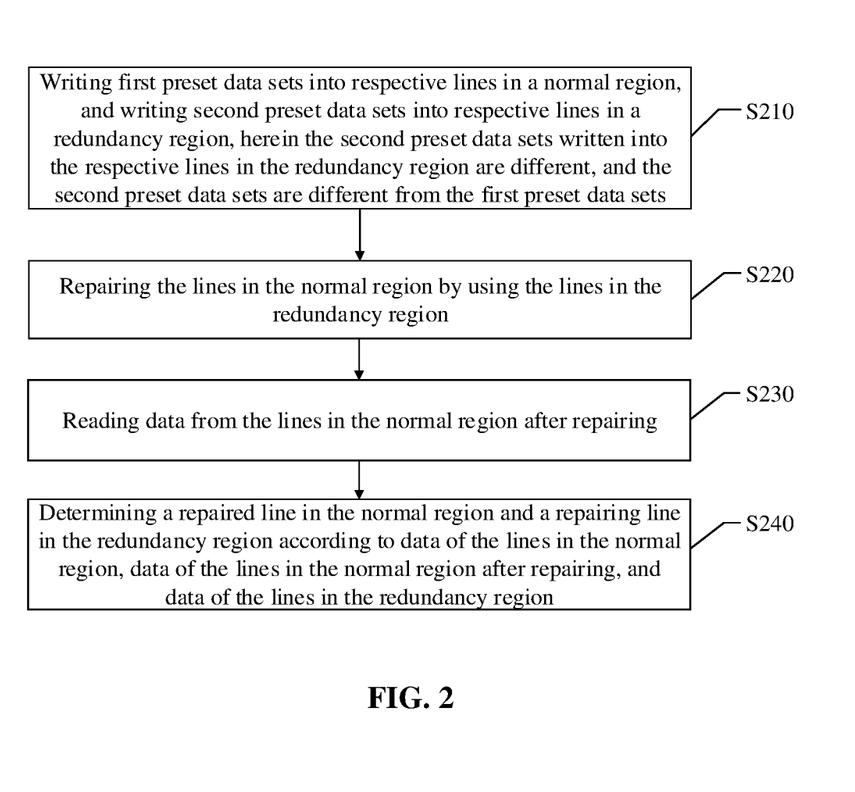
FIG. 2 illustrates a schematic flowchart of a method for determining a repaired line and a repairing line in a memory according to an exemplary embodiment of the disclosure.

FIG. 2 illustrates a schematic flowchart of a method for determining a repaired line and a repairing line in a memory according to some embodiments of the disclosure. Referring to FIG. 2, the method for determining a repaired line and a repairing line in a memory includes steps S210 to S240.

In step S210, the first preset data sets are written into the respective lines in a normal region, and the second preset data sets are written into the respective lines in a redundancy region. Herein the second preset data sets written into the respective lines in the redundancy region are different, and the second preset data sets are different from the first preset data sets.

In step S220, the lines in the normal region are repaired by using the lines in the redundancy region.

In step S230, the data is read from the lines in the normal region after repairing.

In step S240, a repaired line in the normal region and a repairing line in the redundancy region are determined according to the data of the lines in the normal region, the data of the lines in the normal region after repairing, or the data of the lines in the redundancy region.

According to the method for determining the repaired line and the repairing line in a memory in this exemplary embodiment, in one aspect, the first preset data sets are written into the lines in a normal region, and then different second preset data sets are written into the lines in a redundancy region to mark the lines in the redundancy region respectively, so that when the lines in the redundancy region are used to repair the lines in the normal region, a repaired line in the normal region may be determined according to the data read from the lines in the normal region after repairing. In another aspect, a repairing line in the redundancy region for the repair may be determined by comparing the data read from the lines in the normal region after repairing and the data read from the lines in the redundancy region. In another aspect, it may be determined whether an actual repair manner is the same as a repair manner specified in a preset repair rule according to the repaired line and the repairing line, thereby verifying the accuracy of the preset repair rule.

Below, the method for determining the repaired line and the repairing line in a memory in this exemplary embodiment is further described.

In step S210, the first preset data sets are written into the respective lines in a normal region, and the second preset data sets are written into the respective lines in a redundancy region. Herein the second preset data sets written in the respective lines in the redundancy region are different, and the second preset data sets are different from the first preset data sets.

In some exemplary embodiments of the disclosure, as illustrated in FIG. 1, a failure position 113 is a position in the normal region 110, and the failure position 113 is on a WL 111 or a BL 112. Therefore, an RWL 121 may be used to replace a WL 111 to repair the failure position 113. Alternatively, a RBL 122 may be used to replace a BL 112 to repair the failure position 113. According to the method for determining the repaired line and the repairing line in a memory provided in the exemplary embodiments of the disclosure, a specific repairing position and a specific repaired position may be determined in a repair process.

In an exemplary embodiment of the disclosure, lines in the normal region and the redundancy region may be column lines, i.e., WLs, or may be row lines, i.e., BLs. When the lines are column lines, the first preset data sets are first preset data columns, and the second preset data set are second preset data columns. When the lines are row lines, the first preset data set are first preset data rows, and the second preset data set are second preset data rows.

Below, the repair for a WL is used as an example, that is, a column line is used as an example, to describe the case of writing the first preset data sets into the respective lines in a normal region, herein the first preset data sets written into the respective lines may be same or different, and the case of writing different second preset data sets into the respective lines in the redundancy region.

It is assumed that before repairing, data written into the lines in the normal region is illustrated in Table 1.

TABLE 1

| | Column line | | | | |
|---|---|---|---|---|---|
| Row line | WL0 | WL1 | WL2 | WL3 | WL4 |
| BL0 | 0 | 0 | 0 | 0 | 0 |
| BL1 | 0 | 0 | 0 | 0 | 0 |
| BL2 | 0 | 0 | 0 | 0 | 0 |
| BL3 | 0 | 0 | 0 | 0 | 0 |
| BL4 | 0 | 0 | 0 | 0 | 0 |
| BL5 | 0 | 0 | 0 | 0 | 0 |
| BL6 | 0 | 0 | 0 | 0 | 0 |
| BL7 | 0 | 0 | 0 | 0 | 0 |

Column lines include a total of five WLs, i.e., WL0 to WL4, and row lines include a total of eight BLs, i.e., BL0 to BL7. The first preset data sets having all 0 data are written into the respective column lines.

In some exemplary embodiments of the disclosure, the data in the first preset data sets may be all 1. Alternatively, at least part of the first preset data sets written into the respective lines in the normal region is different. For example, an all-0 data set is written into the column line corresponding to WL0, an all-1 data set is written into the column line corresponding to WL1, an all-1 data set is written into the column line corresponding to WL2, an all-0 data set is written into the column line corresponding to WL3, an all-1 data set is written into the column line corresponding to WL4, and so on. As long as it is convenient to determine a repaired line after repairing, a specific first preset data set is not specially limited in the exemplary embodiments of the disclosure.

Corresponding to the data written into the lines in the normal region before repairing illustrated in Table 1, Table 2 illustrates data written in the lines in the redundancy region for repairing the lines in the normal region.

TABLE 2

| | Column line | | | | |
|---|---|---|---|---|---|
| Row line | RWL0 | RWL1 | RWL2 | RWL3 | RWL4 |
| RBL0 | 1 | 0 | 1 | 0 | 1 |
| RBL1 | 0 | 1 | 1 | 0 | 0 |
| RBL2 | 0 | 0 | 0 | 1 | 1 |
| RBL3 | 0 | 0 | 0 | 0 | 0 |
| RBL4 | 0 | 0 | 0 | 0 | 0 |
| RBL5 | 0 | 0 | 0 | 0 | 0 |

Column lines RWL0 to RWL4 in the redundancy region are used for repairing one or more of the column lines WL0 to WL4 in the normal region, a specific repairing line and a specific repaired line are determined in subsequent steps.

It may be seen from Table 2 that, the second preset data sets written into the column lines in the redundancy region are different to mark the column lines, thereby facilitating subsequent determination of a repairing line.

Moreover, as can be seen by combining Table 1 and Table 2, the second preset data sets are different from the first preset data sets, so that after the lines in the normal region are repaired by using the lines in the redundancy region, a repaired line in the normal region can be determined very easily.

It is to be understood that if the same first preset data set is written into all lines in the normal region, during the determination of a repairing line, it is only necessary to find out a line having different data in the entire normal region, so that the time consumed to determine a repaired line in the normal region can be reduced, thereby increasing a rate of determining repaired lines. For example, if all-0 data is written into the lines in the normal region, in this case, after repairing, it is only necessary to find data 1 in the normal region, and a line with 1 is a repaired line to be determined. If all-1 data is written into the lines in the normal region, in this case, after repairing, it is only necessary to find data 0 in the normal region, and a line with 0 is a repaired line to be determined.

In some exemplary embodiments of the disclosure, specifically, the step of writing the first preset data sets into the respective lines in a normal region may include: writing the first preset data sets into the respective lines in the normal region line by line. For example, the first preset data set corresponding to the column line WL0 is firstly written. Next, the first preset data set corresponding to the column line WL1 is written. Then, the first preset data set corresponding to the column line WL2 is written. The first preset data set corresponding to the column line WL3 is then written. Finally, the first preset data set corresponding to the column line WL4 is written. The first preset data sets written into the lines in the normal region may be same or different.

Similarly, the step of writing the second preset data sets into the respective lines in a redundancy region may include: writing the second preset data sets into the respective lines in the redundancy region line by line. The second preset data sets written into the lines in the redundancy region are different.

In step S220, the lines in the normal region are repaired by using the lines in the redundancy region.

The method for determining the repaired line and the repairing line in a memory provided in the exemplary embodiments of the disclosure may be used in a test phase of the normal region. In the test phase, a repair function of the normal region may be turned off before the first preset data sets are written into the respective lines in the normal region. Since the repair for the normal region is temporary repair in the test phase, and the state after the repair will revert to the state before the repair, the experimental data can be provided for supporting the determination of a repair solution of the normal region.

After the step of writing the first preset data sets and the second preset data sets is implemented according to step S210, the repair function of the normal region may be turned on, and the lines in the normal region can be repaired by using the lines in the redundancy region.

In step S230, data is read from the lines in the normal region after repairing.

The data written into the lines in the normal region illustrated in Table 1 and the data written into the lines in the redundancy region illustrated in Table 2 are used as an example. After the lines in the normal region in Table 1 are repaired by using the lines in the redundancy region in Table 2, the data read from the lines in the normal region after repairing is illustrated in Table 3.

TABLE 3

| Row line | Column line | | | | |
|---|---|---|---|---|---|
| | WL0 | WL1 | WL2 | WL3 | WL4 |
| BL0 | 0 | 0 | 1 | 0 | 0 |
| BL1 | 0 | 0 | 0 | 0 | 0 |
| BL2 | 0 | 0 | 1 | 0 | 0 |
| BL3 | 0 | 0 | 0 | 0 | 0 |
| BL4 | 0 | 0 | 0 | 0 | 0 |
| BL5 | 0 | 0 | 0 | 0 | 0 |
| BL6 | 0 | 0 | 0 | 0 | 0 |
| BL7 | 0 | 0 | 0 | 0 | 0 |

It may be seen from Table 3 that, in the normal region after repairing, data in the column line WL2 has changed. That is, the column line WL2 is a repaired line in the normal region.

It is to be understood that in a process of reading data from the lines in the normal region after repairing, the data may be read line by line or may be read in batches by array. This is not specially limited in the exemplary embodiments of the disclosure.

In step S240, a repaired line in the normal region and a repairing line in the redundancy region are determined according to the data of the lines in the normal region, the data of the lines in the normal region after repairing, and the data of the lines in the redundancy region.

In an exemplary embodiment of the disclosure, in a process of determining a repaired line and a repairing line, it is only necessary to compare the data, so that it is more convenient to determine the repaired line and the repairing line.

The repaired line in the normal region may be determined according to the data of the lines in the normal region and the data of the lines in the normal region after repairing. Specifically, a line in the normal region after repairing having data different than data of a respective line in the normal region may be determined as a repaired line. For example, as can be seen by comparing Table 1 and Table 3, the data in the column line WL2 in Table 3 is different from the data in the column line WL2 in Table 1, and a change has occurred. Therefore, it may be determined that the column line WL2 in the normal region is a repaired line.

In an exemplary embodiment of the disclosure, the repairing line in the redundancy region may be determined according to the data of the lines in the normal region after repairing and the data of the lines in the redundancy region. Specifically, a line in the redundancy region having the same data as a line in the normal region after repairing may be determined as the repairing line. For example, as can be seen by comparing Table 2 and Table 3, the data in the column line WL2 in Table 3 is the same as the data in the column line WL4 in Table 2. Therefore, it may be determined that the column line WL4 in the redundancy region is a repairing line.

In an exemplary embodiment of the disclosure, after the repaired line and the repairing line are determined, the accuracy of a preset repair rule may be verified according to the determined repairing line and repaired line. For example, it is assumed that it is set in the preset repair rule that the column line WL4 in the redundancy region is used to repair the column line WL2 in the normal region. In this case, it may be determined that the preset repair rule is accurate according to the foregoing result.

However, it is assumed that the column line WL3 in the redundancy region is set in the preset repair rule to be used to repair the column line WL2 in the normal region. In this case, it may be determined that the preset repair rule is inaccurate according to the foregoing result. Moreover, if all data in the determined repaired line is different from data in the redundancy region, in this case, it also indicates that the preset repair rule is inaccurate. In a case that the preset repair rule is inaccurate, the preset repair rule needs to be adjusted and modified, to redetermine a new repair rule.

In some exemplary embodiments of the disclosure, the above preset repair rule is only an example for description. There may be multiple different rules in practice. However, no matter which preset repair rule is used, it may be verified by using the method for determining the repaired line and the repairing line in a memory provided in the exemplary embodiments of the disclosure. The preset repair rule is not specially limited in the exemplary embodiments of the disclosure.

Figure 3:
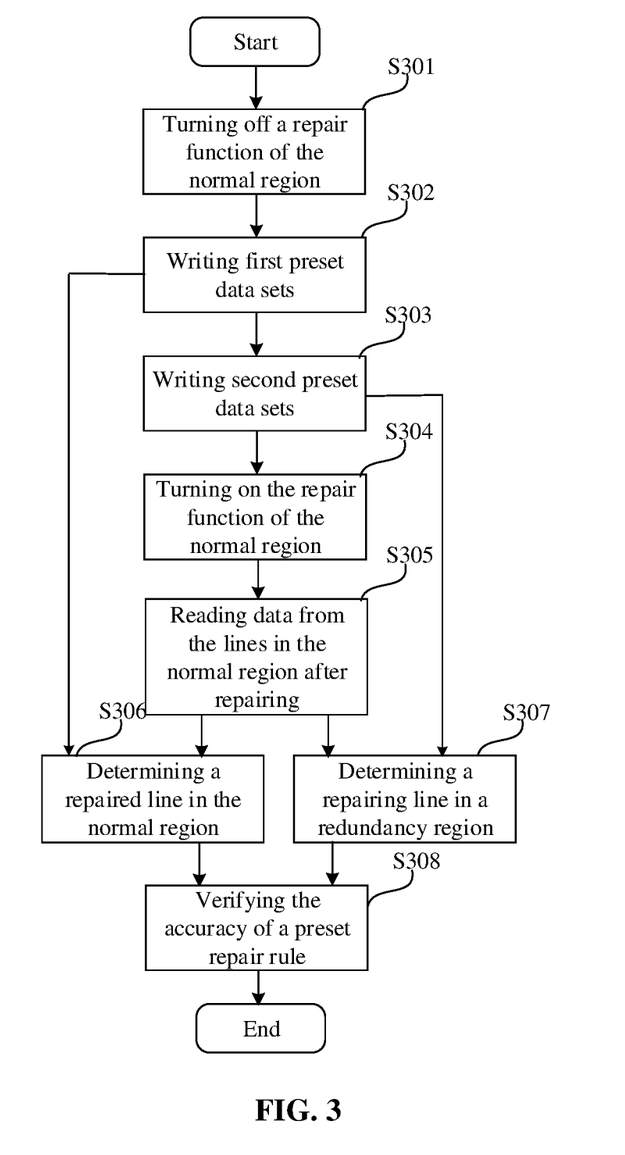
FIG. 3 illustrates a flowchart of the steps of determining a repaired line and a repairing line in a memory according to an exemplary embodiment of the disclosure.

FIG. 3 is a flowchart of steps of determining the repaired line and the repairing line in a memory corresponding to an exemplary embodiment of the disclosure. In FIG. 3, a process of determining the repaired line and the repairing line in a memory includes the following steps. Step S301 is entered firstly, in step S301, a repair function of a normal region is turned off. Next, step S302 is entered, in step S302, the first preset data sets are written into the respective lines in the normal region. In step S303, the second preset data sets are written into lines in a redundancy region. In step S304, the repair function of the normal region is turned on. In step S305, the data is read from the lines in the normal region after repairing. In step S306, a repaired line in the normal region is determined according to the data of the lines in the normal region and the data of the lines in the normal region after repairing. In step S307, a repairing line in the redundancy region is determined according to the data of the lines in the normal region after repairing and the data of the lines in the redundancy region. In step S308, the accuracy of a preset repair rule is verified according to the repairing line and the repaired line.

It is to be understood that although the steps of the method in the disclosure are described in the accompanying drawings in a particular order, it is not required or implied that the steps must be performed in a particular order or that all of the steps illustrated must be performed to achieve the desired result. Additionally or alternatively, some steps may be omitted, a plurality of steps may be combined into one step for execution, and/or one step may be divided into a plurality of steps for execution, or the like.

Figure 4:
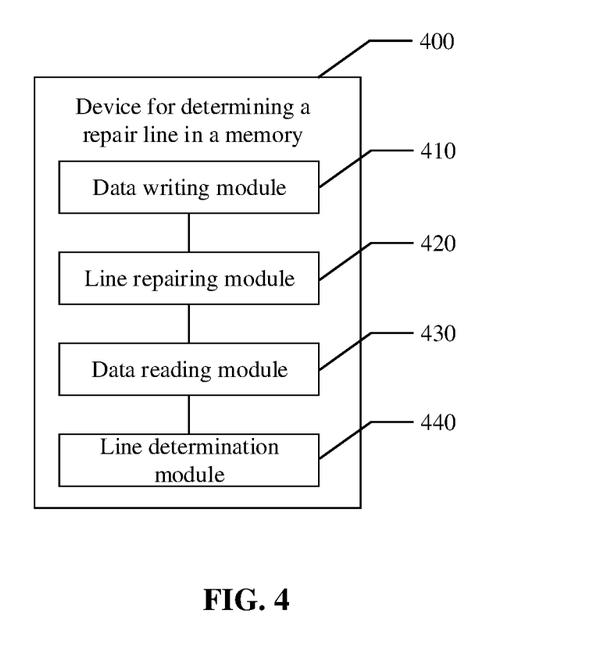
FIG. 4 illustrates a block diagram of a device for determining a repaired line and a repairing line in a memory according to an exemplary embodiment of the disclosure.

Furthermore, in this exemplary embodiment, a device for determining the repaired line and the repairing line in a memory is further provided. Referring to FIG. 4, the device 400 for determining the repaired line and the repairing line in a memory may include a data writing module 410, a line repairing module 420, a data reading module 430, and a line determination module 440.

The data writing module 410 may be configured to: write first preset data sets into respective lines in a normal region, and write second preset data sets into respective lines in a redundancy region. Herein the second preset data sets written into the lines in the redundancy region are different, and the second preset data sets are different from the first preset data sets.

The line repairing module 420 may be configured to repair the lines in the normal region by using the lines in the redundancy region.

The data reading module 430 may be configured to read data from the lines in the normal region after repairing.

The line determination module 440 may be configured to determine a repaired line in the normal region and a repairing line in the redundancy region according to the data of the lines in the normal region, the data of the lines in the normal region after repairing, or the data of the lines in the redundancy region.

Specific details of virtual modules of the foregoing device 400 for determining the repaired line and the repairing line in a memory have been described in detail in the corresponding method for determining the repaired line and the repairing line in a memory. Therefore, details will not be elaborated herein.

It is to be understood that although multiple modules or units of the device for determining the repaired line and the repairing line in a memory have been mentioned in the above detailed description, this partition is not compulsory. Actually, according to the embodiments of the disclosure, features and functions of two or more modules or units as described above may be embodied in one module or unit. In contrast, features and functions of one module or unit as described above may be further embodied in more modules or units.

Further, the above accompanying drawings are merely schematic description of the processing included in the methods according to exemplary embodiments of the disclosure, and are not intended to be limiting. It is readily understood that the processing illustrated above in the accompanying drawings does not indicate or limit the temporal order of such processing. It is also readily understood that these processes may be performed, for example, in multiple modules, either synchronously or asynchronously.

In exemplary embodiments of the disclosure, an electronic device that can implement the foregoing method is further provided.

Those skilled in the art can understand that aspects of the disclosure can be implemented as systems, methods, or program products. Accordingly, aspects of the disclosure may be specifically implemented in the form of a fully hardware embodiment, a fully software embodiment (including firmware, microcode, or the like), or a combination of hardware and software aspects, which may be collectively referred to herein as a "circuit", "module", or "system".

An electronic device 500 according to this embodiment of the disclosure is described below with reference to FIG. 5. The electronic device 500 illustrated in FIG. 5 is only an example, but should not constitute any limitation to the functions and use scope of the embodiments of the disclosure.

Figure 5:
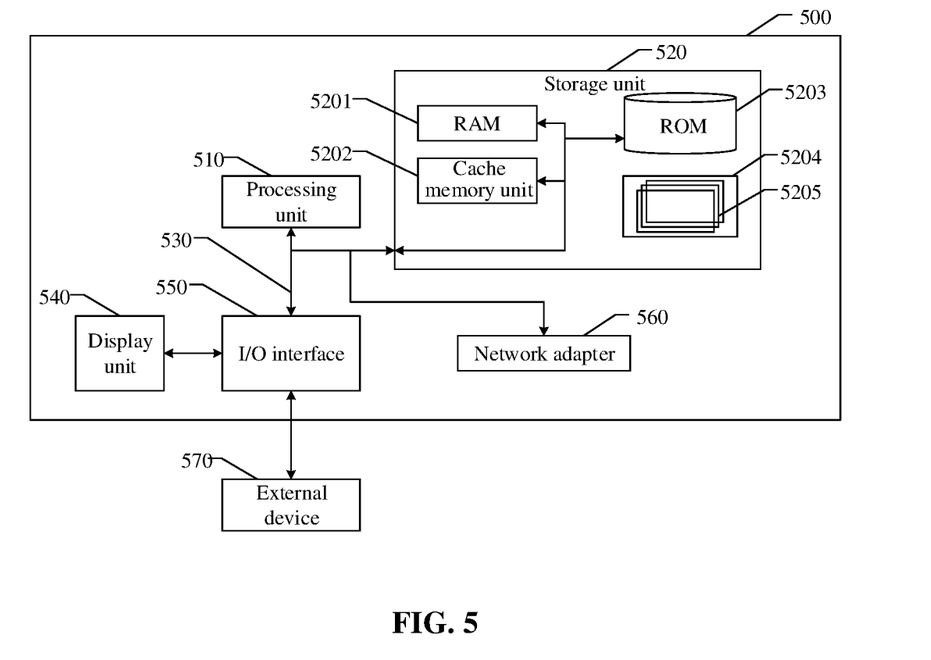
FIG. 5 illustrates a schematic diagram of modules of an electronic device according to an exemplary embodiment of the disclosure.

As illustrated in FIG. 5. The electronic device 500 is embodied in the form of a general-purpose computing device. Components of the electronic device 500 may include, but not limited to, at least one processing unit 510 above, at least one storage unit 520 above, a bus 530 connecting different system components (including the storage unit 520 and the processing unit 510), and a display unit 540.

The storage unit 520 stores program code. The program code can be executed by the processing unit 510 to cause the processing unit 510 to perform the steps of various exemplary embodiments according to the disclosure described in the above "exemplary method part" in this description. For example, the processing unit 510 may perform the following steps. In step S210 illustrated in FIG. 2, first preset data sets are written into respective lines in a normal region, and different second preset data sets are written into respective lines in a redundancy region, herein the second preset data sets are different from the first preset data sets. In step S220, the lines in the normal region are repaired by using the lines in the redundancy region. In step S230, data is read from the lines in the normal region after repairing. In step S240, a repaired line in the normal region and a repairing line in the redundancy region are determined according to the data of the lines in the normal region, the data of the lines in the normal region after repair, and the data of the lines in the redundancy region.

The storage unit 520 may include a readable medium in the form of a volatile storage unit, for example, a Random Access Memory (RAM) unit 5201 and/or a cache memory unit 5202, and may further include a Read-Only Memory (ROM) unit 5203.

The storage unit 520 may further include a program/utility 5204 having a set of (at least one) program modules 5205. Such a program module 5205 includes, but not limited to, an operating system, one or more applications, other program modules, and program data. Each or a combination of these examples may include an implementation in a network environment.

The bus 530 may be a local bus that represents one or more of several types of bus structures, and includes a memory cell bus or a memory cell controller, a peripheral bus, a graphics acceleration port, a processing unit, or any local bus using any of the multiple bus structures.

The electronic device 500 may also communicate with one or more external devices 570 (for example, a keyboard, a pointing device or a Bluetooth device), and may also communicate with one or more devices that enable a user to interact with the electronic device 500, and/or with any device (for example, a router or a modem) that enables the electronic device 500 to communicate with one or more other computing devices. This communication may be performed via an Input/output (I/O) interface 550. Further, the electronic device 500 may also communicate with one or more networks (for example, a Local Area Network (LAN), a Wide Area Network (WAN), and/or a public network such as the Internet) through a network adapter 560. As illustrated in the figure, the network adapter 560 communicates with other modules of the electronic device 500 via the bus 530. It is to be understood that although not illustrated in the figures, other hardware and/or software modules (including, but not limited to, microcode, a device drive, a redundant processing unit, an external disk drive array, a Redundant Array of Inexpensive Disks (RAID) system, a tape drive, and a data backup storage system) may be used in combination with the electronic device 500.

As can be known from the description of the foregoing implementations, persons skilled in the art may easily understand that the exemplary implementations described herein may be implemented by using software or software plus necessary hardware. Therefore, the foregoing technical solutions according to the implementations of the disclosure may be implemented in the form of a software product. The software product may be stored in a non-volatile storage medium (for example, a Compact Disc Read-Only Memory (CD-ROM), a Universal Serial Bus (USB) disk, or a removable hard disk) or a network, and includes several instructions for instructing a computing device (which may be a personal computer, a server, a terminal apparatus or a network device) to implement the methods in the embodiments of the disclosure.

In exemplary embodiments of the disclosure, a computer-readable storage medium is further provided. The computer-readable storage medium stores a program product capable of implementing the method described above in this description. In some possible embodiments, aspects of the disclosure may also be implemented in the form of a program product that includes program code. When the program product is run on a terminal device, the program code causes the terminal device to perform the steps of various exemplary embodiments according to the disclosure described in the above "exemplary method part" in this description.

In exemplary embodiments of the disclosure, a portable CD-ROM may be used. The CD-ROM includes program code and may be run on a terminal device such as a personal computer. However, the program product of the disclosure is not limited thereto. In the document, the readable storage medium may be any tangible medium that contains or stores a program. The program may be used by or in combination with an instruction execution system, apparatus or device.

The program product may use any combination of one or more readable media. The readable medium may be a readable signal medium or a readable storage medium. The readable storage medium may be, for example, but not limited to, an electronic, magnetic, optical, electromagnetic, infrared, or semiconductor system, apparatus or device, or any combination of the foregoing. More specific examples (a non-exhaustive list) of the readable storage medium include: an electrical connection having one or more wires, a portable disc, a hard disk, a RAM, a ROM, an Erasable Programmable Read-Only Memory (an EPROM or a flash memory), an optical fiber, a portable CD-ROM, an optical storage device, a magnetic storage device, or any appropriate combination thereof.

The computer-readable signal medium may include a propagated data signal carrying readable program code embodied therein, for example, in baseband or as part of a carrier wave. Such a propagated data signal may take any of a variety of forms, including, but not limited to, an electromagnetic signal, an optical signal, or any suitable combination thereof. The readable signal medium may be any readable medium that is not a readable storage medium and can communicate, propagate, or transport a program for use by or in combination with an instruction execution system, apparatus or device.

The program code embodied on a readable medium may be transmitted using any appropriate medium, including but not limited to a wireless medium, a wired medium, an optical fiber cable, RF, or any suitable combination thereof.

The program code for performing the operations of the disclosure may be written in any combination of one or more programming languages. The programming languages include object-oriented programming languages such as Java and C++, and further include conventional procedural programming languages such as the "C" language or similar programming languages. The program code may be executed entirely on a user's computing device, partially on the user's computing device, as a stand-alone software package, partially on the user's computing device and partially on a remote computing device, or entirely on a remote computing device or server. In the case of a remote computing device, the remote computing device may be connected to the user's computing device via any type of network, including a LAN or a WAN, or may be connected to an external computing device (for example, using an Internet service provider to connect via the Internet).

Further, the above accompanying drawings are merely schematic description of the processing included in the methods according to exemplary embodiments of the disclosure, and are not intended to be limiting. It is readily understood that the processing shown above in the accompanying drawings does not indicate or limit the temporal order of such processing. It is also readily understood that these processes may be performed, for example, in multiple modules, either synchronously or asynchronously.

Other embodiments of the disclosure will be easily conceived by those skilled in the art after taking the Description into consideration and practicing the solution disclosed herein. The disclosure is intended to cover any variations, uses, or adaptive changes of the disclosure. These variations, uses, or adaptive changes follow the general principles of the disclosure and include common general knowledge or conventional technical means in the art that are not disclosed herein. The Description and the embodiments are to be regarded as being exemplary only. The true scope and spirit of the disclosure are subject to the claims.

It is to be understood that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A method for determining a repaired line and a repairing line in a memory, comprising:
    writing first preset data sets into respective lines in a normal region, and writing second preset data sets into respective lines in a redundancy region, wherein the second preset data sets written into the respective lines in the redundancy region are different, and the second preset data sets are different from the first preset data sets;
    repairing the lines in the normal region by using the lines in the redundancy region;
    reading data from the lines in the normal region after repairing; and
    determining a repaired line in the normal region and a repairing line in the redundancy region according to at least one of: data of the lines in the normal region, the data of the lines in the normal region after repairing, or data of the lines in the redundancy region;
    wherein the method is performed in a test phase of the normal region.

2. The method for determining the repaired line and the repairing line in the memory of claim 1, wherein data in the first preset data sets are all 0 or all 1.

3. The method for determining the repaired line and the repairing line in the memory of claim 1, wherein at least part of the first preset data sets written into the respective lines in the normal region are different.

4. The method for determining the repaired line and the repairing line in the memory of claim 1, wherein repairing the lines in the normal region by using the lines in the redundancy region comprises:
    turning on a repair function of the normal region.

5. The method for determining the repaired line and the repairing line in the memory of claim 4, further comprising:
    before writing the first preset data sets into the respective lines in the normal region, turning off the repair function of the normal region.

6. The method for determining the repaired line and the repairing line in the memory of claim 1, wherein the lines are column lines or row lines.

7. The method for determining the repaired line and the repairing line in the memory of claim 6, wherein when the lines are column lines, the first preset data sets are first preset data columns, and the second preset data sets are second preset data columns.

8. The method for determining the repaired line and the repairing line in the memory of claim 6, wherein when the lines are row lines, the first preset data sets are first preset data rows, and the second preset data sets are second preset data rows.

9. The method for determining the repaired line and the repairing line in the memory of claim 1, wherein determining the repaired line in the normal region and the repairing line in the redundancy region according to at least one of: the data of the lines in the normal region, the data of the lines in the normal region after repair, or the data of the lines in the redundancy region comprises:
   determining the repaired line in the normal region according to the data of the lines in the normal region and the data of the lines in the normal region after repairing; and
   determining the repairing line in the redundancy region according to the data of the lines in the normal region after repairing and the data of the lines in the redundancy region.

10. The method for determining the repaired line and the repairing line in the memory of claim 9, wherein determining the repaired line in the normal region according to the data of the lines in the normal region and the data of the lines in the normal region after repairing comprises:
   determining a line in the normal region after repairing having data different than data of a respective line in the normal region as the repaired line.

11. The method for determining the repaired line and the repairing line in the memory of claim 9, wherein determining the repairing line in the redundancy region according to the data of the lines in the normal region after repairing and the data of the lines in the redundancy region comprises:
   determining a line in the redundancy region having same data as a line in the normal region after repairing as the repairing line.

12. The method for determining the repaired line and the repairing line in the memory of claim 1, further comprising:
   verifying an accuracy of a preset repair rule according to the repairing line and the repaired line.

13. The method for determining the repaired line and the repairing line in the memory of claim 1, wherein writing the first preset data sets into the respective lines in the normal region comprises:
   writing the first preset data sets into the respective lines in the normal region line by line.

14. The method for determining the repaired line and the repairing line in the memory of claim 1, wherein writing the second preset data sets into the respective lines in the redundancy region comprises:
   writing the second preset data sets into the respective lines in the redundancy region line by line.

15. The method for determining the repaired line and the repairing line in the memory of claim 1, further comprising:
   reading data from the lines in the normal region after repairing line by line.

16. The method for determining the repaired line and the repairing line in the memory of claim 1, further comprising:
   reading data from the lines in the normal region after repairing in batches by array.

17. A device for determining a repaired line and a repairing line in a memory, comprising:
   a processor; and
   a memory, configured to store one or more programs, wherein the one or more programs, when executed by the processor in a test phase of a normal region, cause the processor to:
   write first preset data sets into respective lines in the normal region, and write second preset data sets into respective lines in a redundancy region, wherein the second preset data sets written into the respective lines in the redundancy region are different, and the second preset data sets are different from the first preset data sets;
   repair the lines in the normal region by using the lines in the redundancy region;
   read data from the lines in the normal region after repairing; and
   determine a repaired line in the normal region and a repairing line in the redundancy region according to at least one of: data of the lines in the normal region, the data of the lines in the normal region after repairing, or data of the lines in the redundancy region.

18. A non-transitory computer-readable storage medium having stored thereon a computer program which when executed by a processor in a test phase of a normal region, causes the processor to:
   write first preset data sets into respective lines in the normal region, and write second preset data sets into respective lines in a redundancy region, wherein the second preset data sets written into the respective lines in the redundancy region are different, and the second preset data sets are different from the first preset data sets;
   repair the lines in the normal region by using the lines in the redundancy region;
   read data from the lines in the normal region after repairing; and
   determine a repaired line in the normal region and a repairing line in the redundancy region according to at least one of: data of the lines in the normal region, the data of the lines in the normal region after repairing, or data of the lines in the redundancy region.

* * * * *